US006801114B2

(12) United States Patent
Yang et al.

(10) Patent No.: US 6,801,114 B2
(45) Date of Patent: Oct. 5, 2004

(54) INTEGRATED RADIO HAVING ON-CHIP TRANSFORMER BALUN

(75) Inventors: Hung Yu Yang, Los Angeles, CA (US); Jesse A Castaneda, Los Angeles, CA (US); Reza Rofougaran, Marina Del Ray, CA (US)

(73) Assignee: Broadcom Corp., Irvine, CA (US)

( * ) Notice: Subject to any disclaimer, the term of this patent is extended or adjusted under 35 U.S.C. 154(b) by 0 days.

(21) Appl. No.: 10/055,425

(22) Filed: Jan. 23, 2002

(65) Prior Publication Data

US 2003/0137383 A1 Jul. 24, 2003

(51) Int. Cl.⁷ .............................................. H01F 5/00
(52) U.S. Cl. ...................................... 336/200; 336/232
(58) Field of Search ................................ 336/200, 232

(56) References Cited

U.S. PATENT DOCUMENTS

| | | | | | |
|---|---|---|---|---|---|
| 4,803,453 | A | * | 2/1989 | Tomono et al. ............. | 336/183 |
| 4,816,784 | A | * | 3/1989 | Rabjohn ................... | 333/24 R |
| 5,477,204 | A | * | 12/1995 | Li .............................. | 336/200 |
| 5,877,667 | A | | 3/1999 | Wollesen | |
| 5,886,589 | A | | 3/1999 | Mourant | |
| 6,097,273 | A | * | 8/2000 | Frye et al. ................. | 336/200 |
| 6,133,806 | A | | 10/2000 | Sheen | |
| 6,188,306 | B1 | | 2/2001 | Wollesen | |
| 6,608,364 | B2 | * | 8/2003 | Carpentier ................. | 257/531 |

OTHER PUBLICATIONS

Pub. No. U.S. 2003/0071706 A1; Christensen, Planar Transformer, Apr. 2003.*
Danesh, "A Q–Factor enhancement technique fo MMIC inductors", IEEE MTT–S Digest, pp. 183–186, Jun. 1998.
Zhou, "Monolithic transformers and their application in a differential CMOS RF low–noise amplifier", IEEE Journal of Solid State Circuits, vol. 33, pp. 2020–2027, Dec. 98.
Long, "Monolithic transformers for silicon RF IC design", IEEE Journal of Solid–State Circuits, vol. 35, pp. 1368–1381, Sep. 2000.

* cited by examiner

Primary Examiner—Anh Mai
(74) Attorney, Agent, or Firm—Timothy W. Markison

(57) ABSTRACT

A transformer balun is obtained that is symmetrical in structure, provides high current, or high voltage, amplification and has high coupling coefficients while maintaining minimal overall size. The balun structure includes primary and secondary metal windings at separate layer interfaces. The primary and secondary metal windings are symmetrical and can have any number of turns, which is only limited by integrated circuit area and capacitance. Accordingly, the primary and secondary windings may be on as many layers as needed. Further, the primary and/or secondary may include a center tap ground, which enables the winding to be used as a differential port.

9 Claims, 5 Drawing Sheets top view side view bottom view top view side view bottom view primary winding 70 secondary winding 90

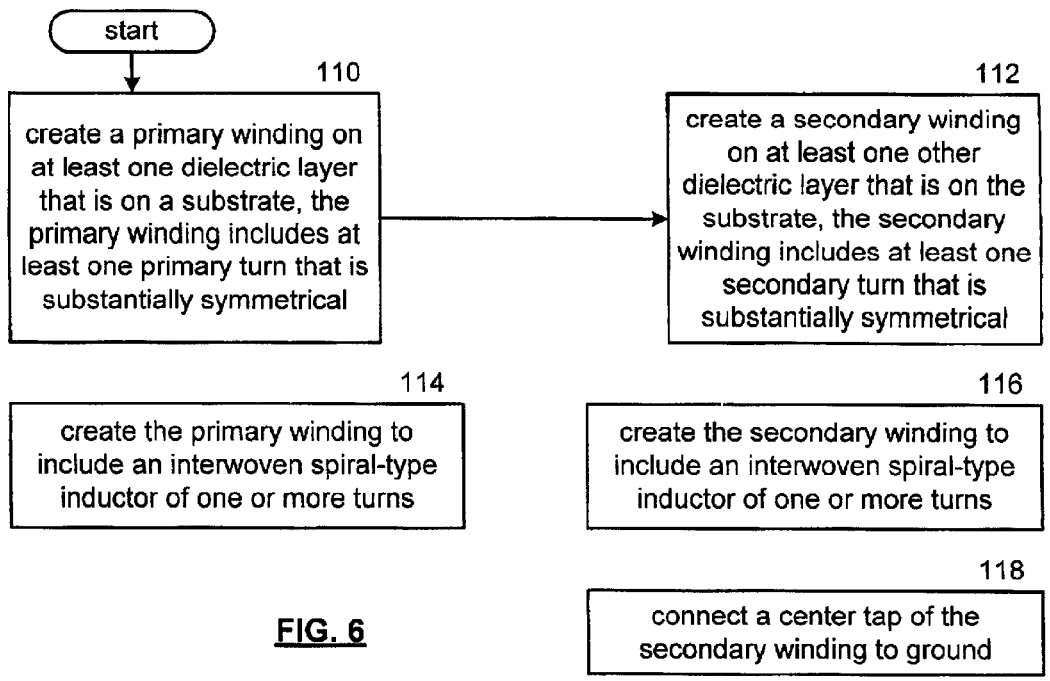
FIG. 6
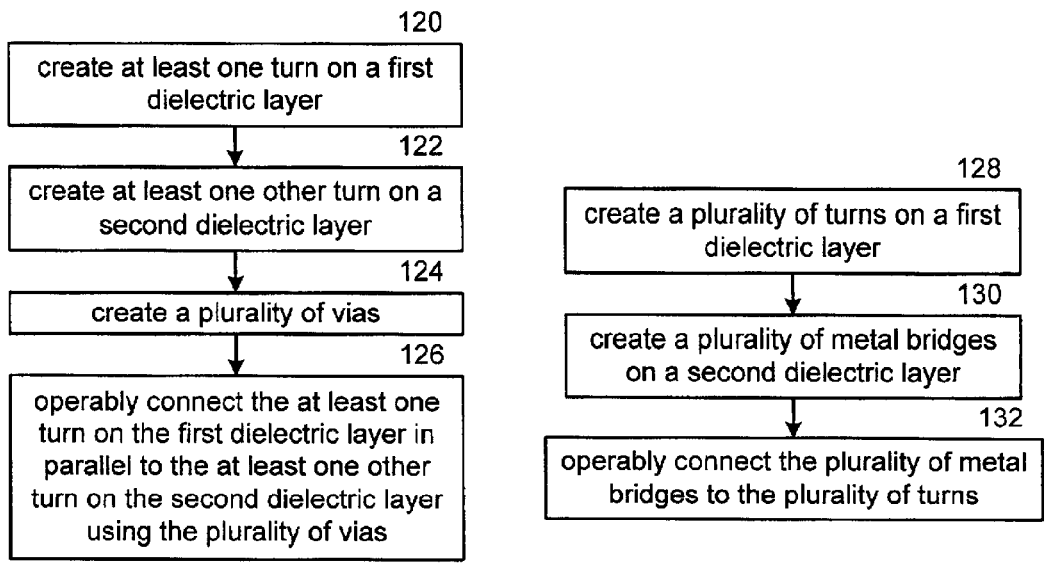
FIG. 7
FIG. 8

INTEGRATED RADIO HAVING ON-CHIP TRANSFORMER BALUN

This invention relates generally to radio communication technology and in particular to transformers used within radios.

BACKGROUND OF THE INVENTION

Two-way radios, which may be incorporated in wireless communication devices, are known to include an antenna, a transformer, an antenna switch, a receiver section, and a transmitter section. The antenna switch couples either the receiver section or the transmitter section to the antenna via the transformer. The transformer may be a transformer balun (balanced/unbalanced) and is generally used to convert single ended signals into differential signals and conversely to convert differential signals into single ended signals. For example, received RF signals via the antenna are converted into differential signals, which are provided to a low noise amplifier of the receiver section. Conversely, differential signals from the transmitter section are converted into single ended signals that are provided to the antenna.

As the demand for integrated radios increases, many attempts have been made to integrate transformers and/or transformer baluns onto radio frequency integrated circuits. However, such integration has been limited due to flux leakage, capacitive coupling limits, and significant series resistance. To reduce these limitations, advances have been made in transformer IC design including coplanar interleaved transformers, toroidal and concentric transformers, overlay transformers and symmetric coplanar transformers. Coplanar interleaved transformers have the primary and secondary windings interleaved on the same integrated circuit layer, where the primary and secondary windings are constructed of planer metal traces. While coplanar interleaved transformers reduces size and resistance and are widely used, they suffer from low quality (Q) factor, small coupling coefficients, and, if used as a balun, the center tap is often at an undesirable location, resulting in an asymmetric geometry. As is known, asymmetry of a transformer winding causes an imbalance in the resulting differential signal and/or an imbalance in the resulting single ended signal from a differential signal.

Toroidal and concentric transformers have the primary and secondary windings on several dielectric layers of an integrated circuit. Each layer includes one or more primary and secondary turns, where turns on different layers are coupled in series using vias. Each of the primary turns, on each layer, is constructed around the secondary turns on the same layer. While such toroidal and concentric transformers are well suited for multi-layer structures, they suffer from weak coupling, inconvenient center tap locations, and are asymmetrical.

Overlay transformers include a primary spiral inductor on a top layer and a secondary spiral inductor on a lower layer. Such transformers have high coupling coefficients and relatively small area; however, the secondary is asymmetrical creating a loading asymmetry.

Symmetric coplanar transformers include the primary and secondary windings on the same layer with interconnecting bridges on lower layers. While such transformers have high symmetry, they have weak magnetic coupling and are usually large for desirable inductor values.

Therefore, a need exists for an on-chip transformer balun that is small, provides reasonable inductance values, has a high quality factor, reduced resistance, and high coupling coefficient.

BRIEF DESCRIPTION OF THE DRAWINGS

FIGS. 6–8 illustrate a logic diagram of a method for manufacturing an on-chip transformer in accordance with the present invention.

DETAIL DESCRIPTION OF A PREFERRED EMBODIMENT

Generally, the present invention provides a transformer balun that is symmetrical in structure, provides high current, or high voltage, amplification, and has high coupling coefficients while maintaining minimal overall size. The balun structure includes primary and secondary metal windings at separate layer interfaces. The primary and secondary metal windings are symmetrical and can have any number of turns, which is only limited by integrated circuit area and capacitance. Accordingly, the primary and secondary windings may be on as many layers as needed. Further, the primary and/or secondary may include a center tap ground, which enables the winding to be used as a differential port. Such a transformer balun is well suited for radio frequency integrated circuits since it provides a symmetrical and balanced on-chip transformer.

Figure 1A:
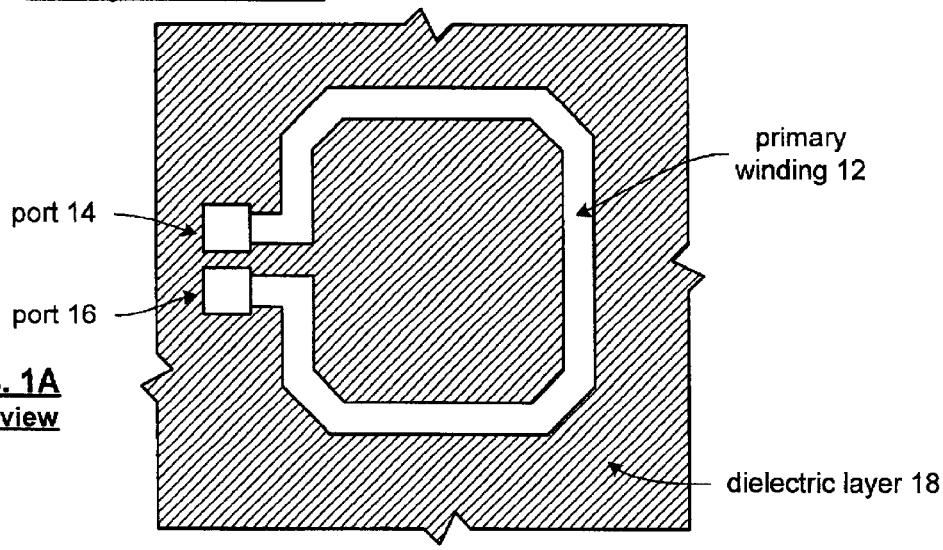
FIGS. 1A–1C illustrate an on-chip transformer in accordance with the present invention.
Figure 1B:
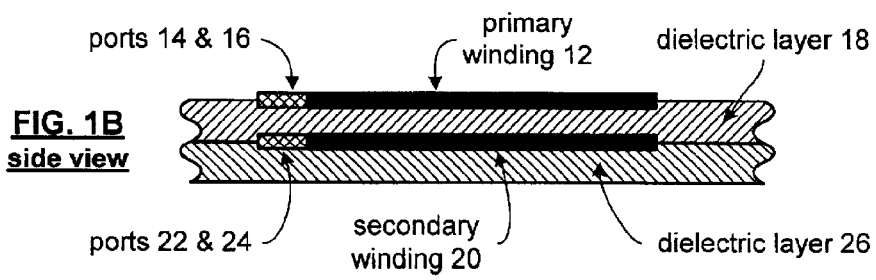
Figure 1C:
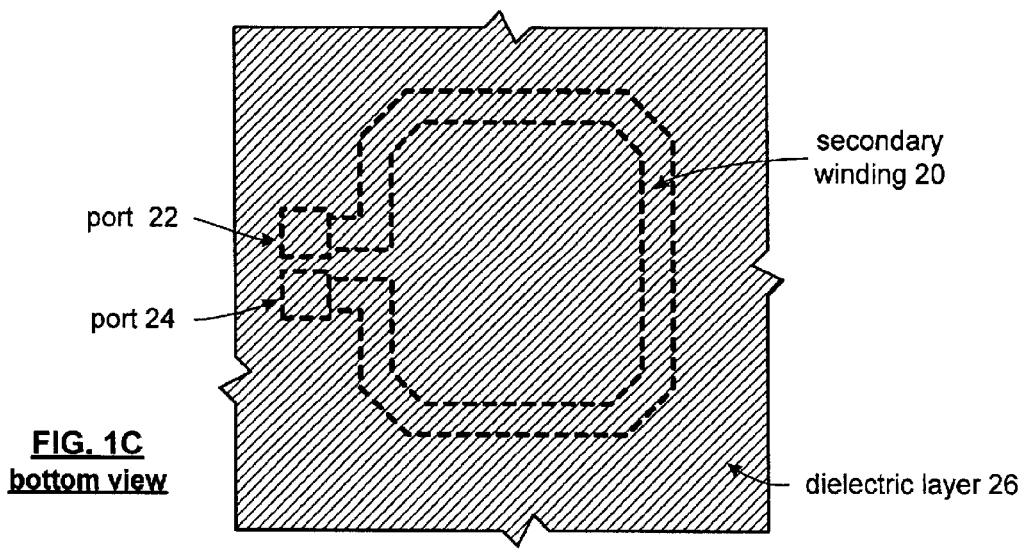

The present invention can be more fully described with reference to FIGS. 1–9. FIGS. 1A–1C illustrate a top, side, and bottom view of an on-chip transformer 10, which may be used in a radio frequency integrated circuit. In FIG. 1A, which illustrates the top view of the on-chip transformer 10, the primary winding 12 is on a dielectric layer 18. The primary winding 12 terminates at ports 14 and 16. The size of the primary winding 12, the number of turns of the primary winding 12, and the width of the conductive material utilized to implement the primary winding 12 are dependent on the desired inductance of the primary winding 12, the current requirements, and quality factor.

FIG. 1B illustrates a cross-sectional side view of the on-chip transformer 10. As shown, the dielectric layer 18 supports the primary winding 12 and ports 14 and 16. Underneath dielectric layer 18 is dielectric layer 26, which supports a secondary winding 20 and ports 22 and 24. In this configuration, the primary and secondary windings have improved magnetic coupling with each other as opposed to transformers that have the primary and secondary on the same layer. In addition, since the primary and secondary windings are symmetrical, the primary or secondary winding may be tapped to provide a differential-to-single ended coupling transformer.

FIG. 1C illustrates the bottom view of the on-chip transformer 10. As shown, the secondary winding 20 has a symmetrical shape with respect to ports 22 and 24 and has a similar shape to primary winding 12. Note that the secondary winding may be rotated 180 degrees, which would change the current flow within the secondary winding.

Figure 2A:
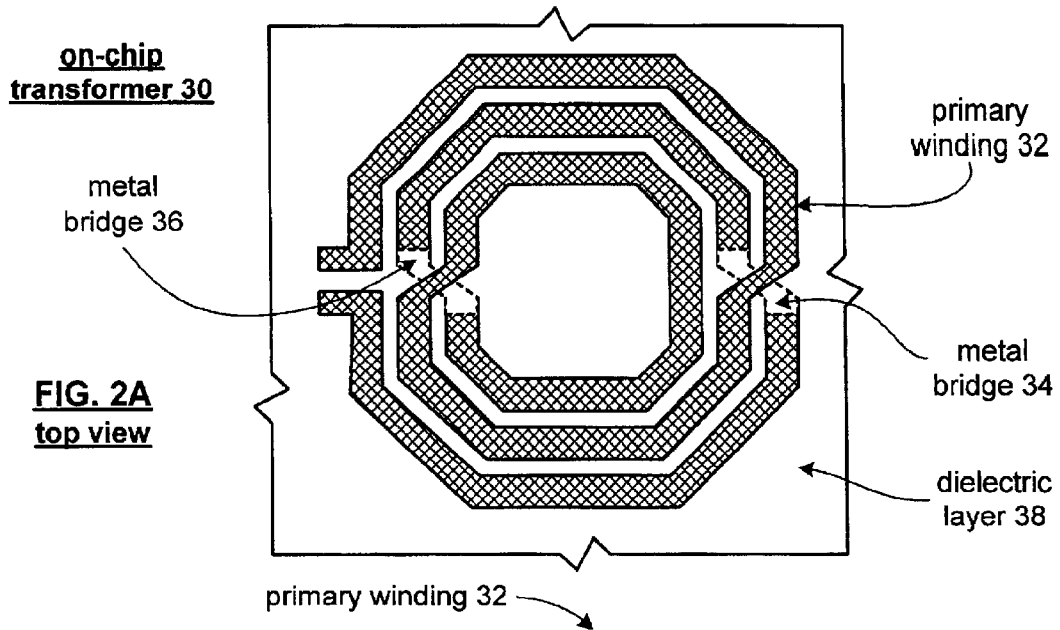
FIGS. 2A–2B illustrate an alternate embodiment of an on-chip transformer in accordance with the present invention.
Figure 2B:
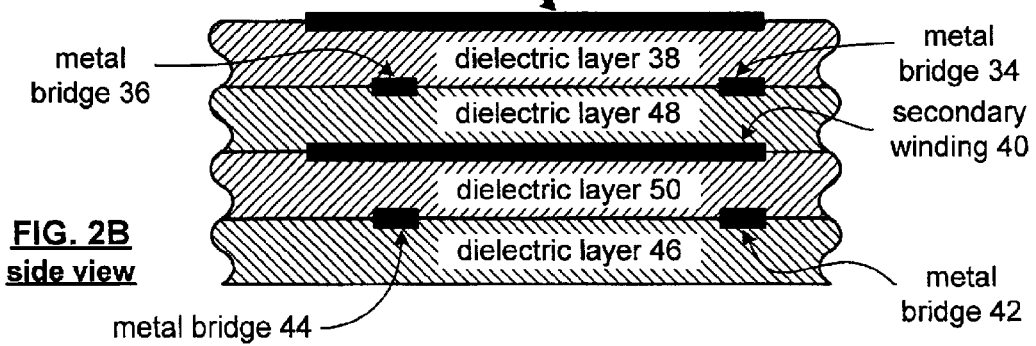
Figure 2C:
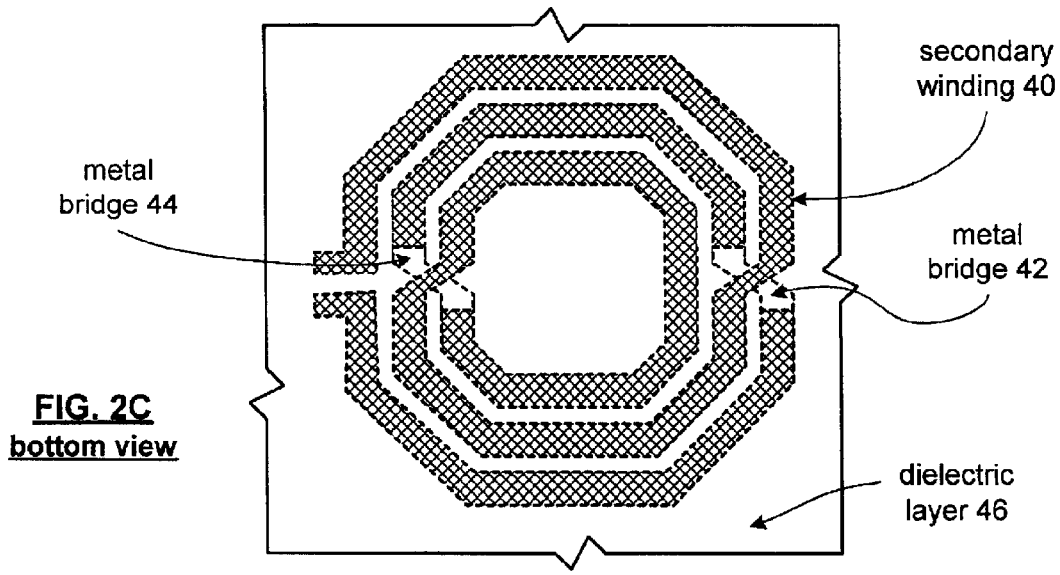

FIGS. 2A–2C illustrate another on-chip transformer 30. In this implementation, the primary winding 32 includes multiple turns that are symmetrical with respect to both ports. As shown in FIG. 2A, which represents the top view of on-chip transformer 30, the primary winding 32 includes metal bridges 34 and 36 to couple various sections of the primary winding together. The primary winding is on dielectric layer 38, while the metal bridges 34 and 36 are on a lower dielectric layer, which enables the primary winding to maintain symmetry.

FIG. 2B illustrates a side view of on-chip transformer 30. As shown, dielectric layer 38 supports the primary winding 32. A lower layer, dielectric layer 48, supports metal bridges 34 and 36. Utilizing conventional integrated circuit technologies, the metal bridges 34 and 36 are coupled to the corresponding portions of the primary 32. As further shown in FIG. 2B, dielectric layer 50 supports the secondary winding 40 while dielectric layer 46 supports the metal bridges 42 and 44.

FIG. 2C illustrates the bottom view of on-chip transformer 30, which shows the secondary winding 40 on dielectric layer 46 and the metal bridges 42 and 44 coupling the secondary winding together. As shown, the secondary winding has a symmetrical pattern with respect to its ports, and is similar to the primary winding 32. As one of average skill in the art will appreciate, the secondary winding 40 may include more or less turns than the primary winding, the secondary winding may be rotated 180 degrees to reverse the current flow through the secondary winding 40. As one of average skill in the art will further appreciate, the number of turns in the primary winding and secondary winding may be more or less than the three illustrated for the on-chip transformer 30. For example, the number of turns may include nine for the primary and nine for the secondary. As one of average skill in the art will further appreciate, the layering of the primary windings and its bridges and the layering of the secondary winding and its bridges may be varied to affect the capacitance between the primary and secondary windings. For example, dielectric layer 46 and 50 may be flipped such that the metal bridges for the primary and secondary windings are on consecutive layers, thus providing greater distance between the primary winding and secondary winding, which decreases capacitance. Conversely, dielectric layer 38 and 48 may be flipped such that the primary winding 32 is closer to secondary winding 40, which would increase the capacitance.

Figure 3:
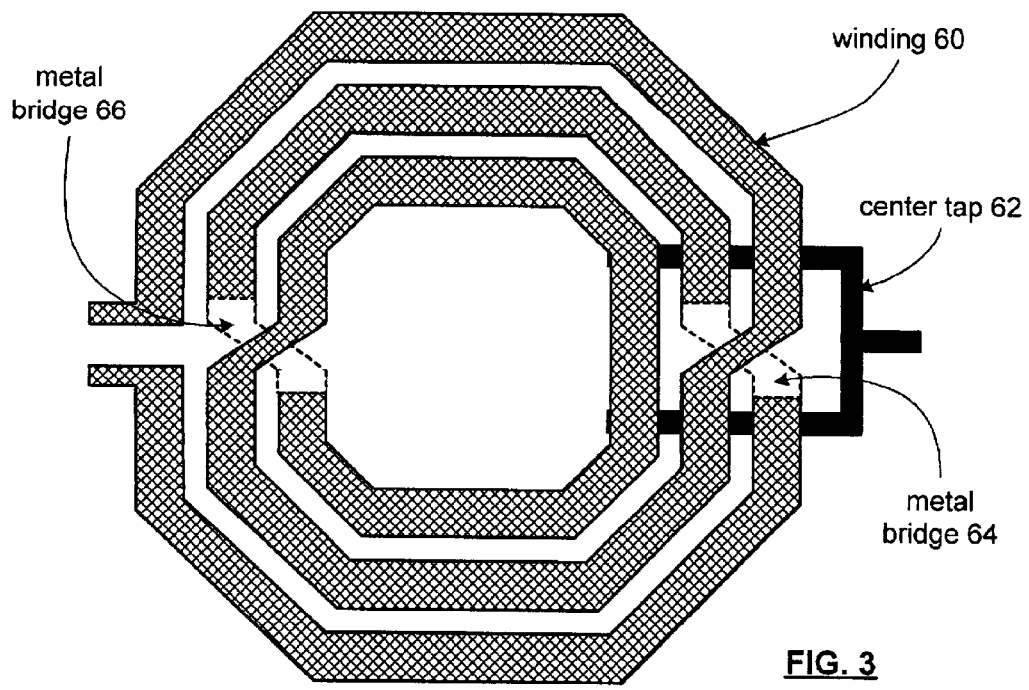
FIG. 3 illustrates a diagram of a primary or secondary winding in accordance with the present invention.

FIG. 3 illustrates a winding 60, which may be a secondary or a primary, having a center tap 62 and metal bridges 64 and 66. As with the discussion of FIG. 2, the metal bridges are used to couple sections of the winding 6-together. The center tap 62 is operably coupled to the winding at the center of the winding with respect to its ports. As such, the winding now provides a differential port with respect to the center tap 62. By locating the center tap 62 as shown, symmetry of the winding 60 is maintained with respect to port-to-port impedances and with respect to port to the center tap 62 impedances.

Figure 4:
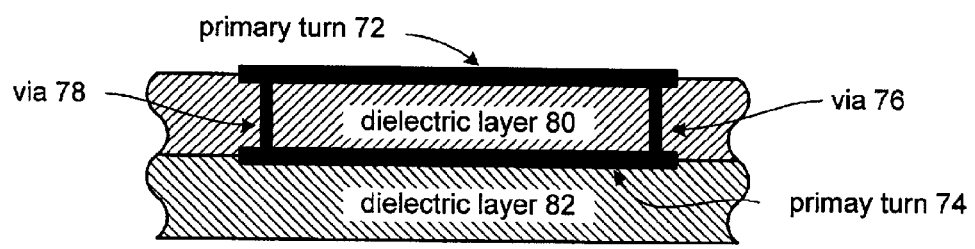
FIG. 4 illustrates a primary winding in accordance with the present invention.

FIG. 4 illustrates a primary winding that is implemented on multiple dielectric layers 80 and 82. In this configuration, the primary winding includes at least one primary turn 72 on dielectric layer 80 and at least one other primary turn 74 on dielectric layer 82. In this configuration, the primary turns 72 and 74 are coupled in parallel utilizing vias 76 and 78. Alternatively, primary turns 72 and 74 may be coupled in series to increase the inductance of the primary winding. Regardless of whether the turns are coupled in series or in parallel, the shape of each turn will be symmetrical.

Figure 5:
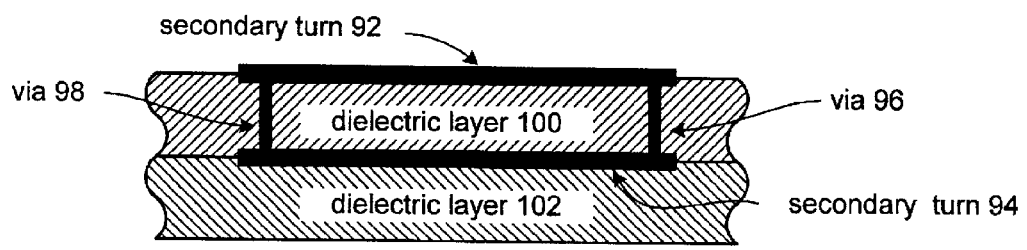
FIG. 5 illustrates a parallel secondary winding in accordance with the present invention.

FIG. 5 illustrates a secondary winding 90 that is implemented on multiple layers. In this illustration, the secondary winding 90 includes a secondary turn 92 and dielectric layer 100 and at least one secondary turn 94 on dielectric layer 102. The secondary turn 92 and secondary turn 94 are operably coupled in parallel utilizing vias 96 and 98. Alternatively, the secondary turn 92 and secondary turn 94 may be coupled in parallel to achieve a greater inductance for the secondary winding 90. For both the primary winding 70 and secondary winding 90, the number of layers utilized and the number of turns on each layer is dependent on the particular application in which the transformer will be utilized. For example, the primary and secondary turns may be on one to six layers, for a six metal layer integrated circuit, and have anywhere from one to nine turns per layer.

FIGS. 6–8 illustrate a logic diagram of a method for manufacturing an on-chip integrated circuit, which is particularly suited for radio frequency integrated circuits. The process begins at Step 110 where a primary winding is created on at least one dielectric layer, which is on a substrate. The primary winding includes at least one turn that is substantially symmetrical. Note that the creation of a primary winding on a dielectric layer may be done by etching, depositing, and/or any other method for fabricating components on an integrated circuit. Further note, as illustrated in Step 114, the primary winding may be created to include an interwoven spiral type inductor of one or more turns. Such an interwoven spiral type inductor is illustrated in FIG. 2.

The process then proceeds to Step 112 where a secondary winding is created on at least one other dielectric layer that is on the substrate. The secondary winding includes at least one secondary turn that is symmetrical. The secondary winding, as shown in Step 116, may be created to include an interwoven spiral type inductor that includes one or more turns as shown in FIGS. 2 and/or 3. Still further, the secondary winding may be constructed as shown at Step 118 to include a center tap that is connected to ground. When the secondary includes a center tap, it provides a differential signal at the end ports.

FIG. 7 illustrates an alternate logic diagram for creating a primary and/or secondary winding for an on-chip transformer in accordance with the present invention. At Step 120, the primary and/or secondary winding has at least one turn created on a $1^{st}$ dielectric layer. The process then proceeds to Step 122 where at least one other turn is created on a second dielectric layer. The process then proceeds to Step 124 where a plurality of vias are created. The process then proceeds to Step 126 where at least one turn on the $1^{st}$ dielectric layer is coupled in parallel to the at least one other turn on the secondary dielectric layer utilizing the vias.

FIG. 8 illustrates a logic diagram of another alternative for creating a primary and/or secondary winding. The process begins at Step 128 where a plurality of turns is created on a $1^{st}$ dielectric layer. The process then proceeds to Step 130 where a plurality of metal bridges are created on a second dielectric layer. The process then proceeds to Step 132 where the plurality of metal bridges are connected to the plurality of turns. This was graphically illustrated in FIGS. 2 and 3.

Figure 9:
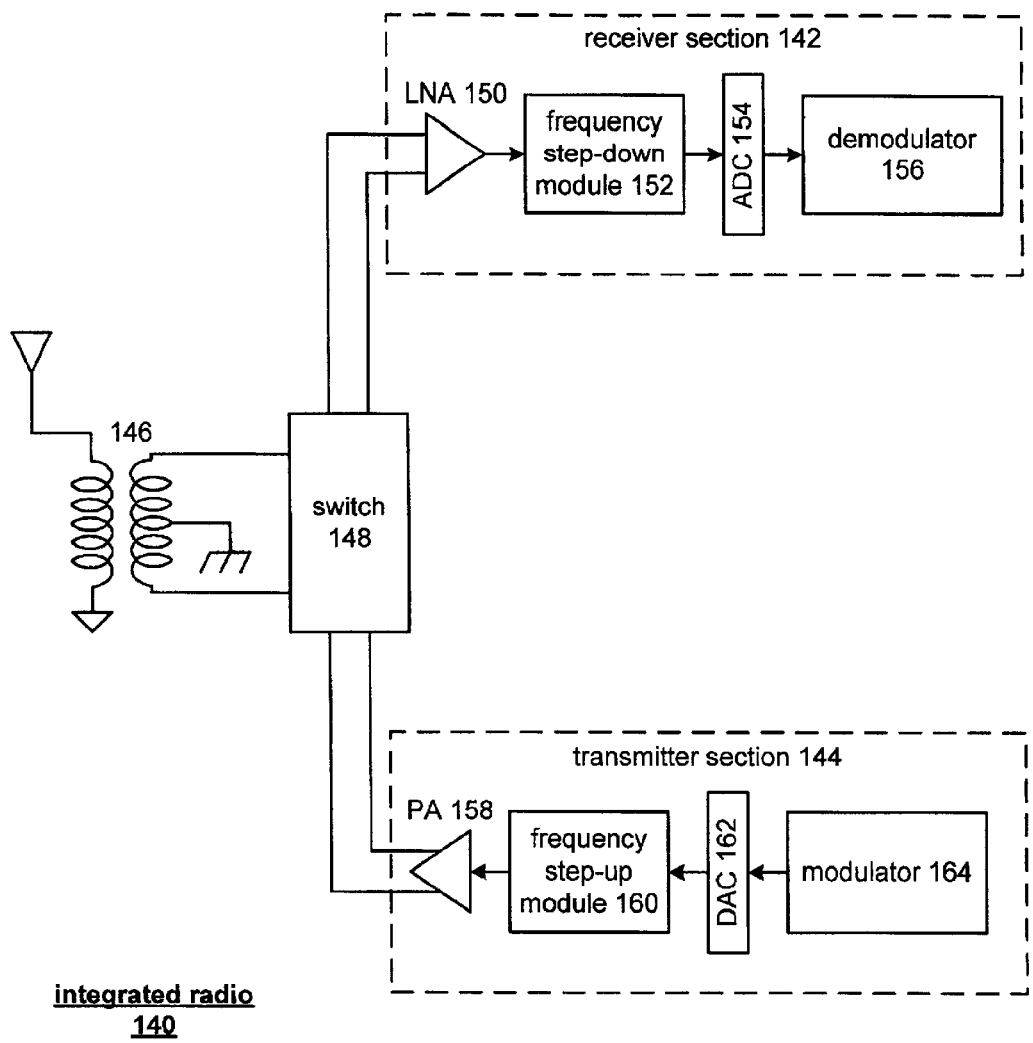
FIG. 9 illustrates a schematic block diagram of an integrated radio including an on-chip transformer in accordance with the present invention.

FIG. 9 illustrates a schematic block diagram of an integrated radio 140 that includes a receiver section 142, a transmitter section 144, an on-chip transformer balun 146 and an antenna switch 148. The receiver section 142 includes a low noise amplifier, frequency step-down module 152, analog-to-digital converter 154 and a demodulator 156.

For the purposes of this discussion, the operation and construct of the elements within the radio receiver 142 are of conventional design. The transformer section 144 includes a modulator 164, digital-to-analog converter 162, frequency step-up module 160 and power amplifier 158. The operation and construction of the elements of transmitter section 144 are of conventional design. Note that the low noise amplifier 150 and power amplifier 158 are differential signals operably coupled to switch 148.

The transformer balun 146, which may be constructed in accordance with FIGS. 1–8 of the present invention, is operably coupled to an antenna and the antenna switch 148. In this configuration, the transformer balun converts single ended signals received via the antenna to differential signals which, via switch 148, are provided to the low noise amplifier 150. Conversely, the balun transformer 146 may receive differential signals from power amplifier 158 via switch 148 and convert them to single ended signals, which are provided to the antenna.

The preceding discussion has presented a balanced on-chip transformer that is symmetrical. As such, the on-chip transformer is well suited for applications for radio frequency integrated circuits. Such an on-chip balanced and symmetrical transformer may be implemented in a variety of ways, some of which have been illustrated in the preceding discussion. As one of average skill in the art will appreciate, other embodiments may be derived from the teaching of the present invention, without deviating from the scope of the claims.

What is claimed is:

1. An integrated radio comprises:
   receiver section operably coupled to convert an inbound radio frequency (RF) signal into an inbound intermediate frequency signal;
   transmitter section operably coupled to convert an outbound intermediate frequency signal into an outbound radio frequency signal (RF); and
   transformer balun operably coupled to receive the inbound RF signal from an antenna and to provide the outbound RF signal to the antenna, wherein the transformer balun includes:
      primary winding having at least one primary turn, wherein the at least one primary turn is substantially symmetrical, and wherein the primary winding is on at least one dielectric layer; and
      secondary winding having at least one secondary turn, wherein the at least one secondary turn is substantially symmetrical, and wherein the secondary winding is on at least one other dielectric layer and is magnetically coupled to the primary winding.

2. The integrated radio of claim 1, wherein the at least one primary turn further comprises:
   a plurality of turns on a first one of the at least one dielectric layer; and
   a plurality of metal bridges on a second one of the at least one dielectric layer, wherein the plurality of metal bridges are operably connected to the plurality of turns to provide the primary winding.

3. The integrated radio of claim 1, wherein the at least one secondary turn further comprises:
   a plurality of turns on a first one of the at least one other dielectric layer; and
   a plurality of metal bridges on a second one of the at least one other dielectric layer, wherein the plurality of metal bridges are operably connected to the plurality of turns to provide the secondary winding.

4. The integrated radio of claim 1 further comprises:
   the primary winding including an interwoven spiral-type primary inductor; and
   the secondary winding including an interwoven spiral-type secondary inductor that is substantially symmetrical to the primary winding.

5. The integrated radio of claim 4 further comprises:
   the interwoven spiral-type primary inductor including a first number of multiple turns; and
   the interwoven spiral-type secondary inductor including a second number of multiple turns.

6. The integrated radio of claim 1, wherein the secondary winding further comprises:
   a center tap operably connected to ground to provide a differential signal at end ports of the secondary winding.

7. The integrated radio of claim 1, wherein the at least one primary turn further comprises:
   at least one turn on a first one of the at least one dielectric layer;
   at least one other turn on a second one of the at least one dielectric layer; and
   a plurality of vias operably connecting the at least one turn on the first one of the at least one dielectric layer in parallel to the at least one other turn on the second one of the at least one dielectric layer to provide the primary winding.

8. The integrated radio of claim 1, wherein the at least one secondary turn further comprises:
   at least one turn on a first one of the at least one other dielectric layer;
   at least one other turn on a second one of the at least one other dielectric layer; and
   a plurality of vias operably connecting the at least one turn on the first one of the at least one other dielectric layer in parallel to the at least one other turn on the second one of the at least one other dielectric layer to provide the secondary winding.

9. The integrated radio of claim 1 further comprises:
   a substrate, wherein the at least one dielectric layer of the primary winding is on the substrate, wherein the at least one other dielectric layer of the secondary winding is on the substrate such that the primary winding is magnetically and capacitively coupled to the secondary winding.

* * * * *